(12) United States Patent  
Raghavan et al.

(10) Patent No.: US 8,850,287 B2  
(45) Date of Patent: Sep. 30, 2014

(54) METHODS AND APPARATUS FOR ZONE GROUP IDENTIFIER REPLACEMENT IN FAST CONTEXT SWITCHING ENHANCED SERIAL ATTACHED SCSI EXPANDERS

(71) Applicant: LSI Corporation, Milpitas, CA (US)

(72) Inventors: Ramprasad Raghavan, Maharashera (IN); Nitin Satishchandra Kabra, Maharashera (IN); Gurvinder Pal Singh, Hosihapur (IN)

(73) Assignee: LSI Corporation, Milpitas, CA (US)

( * ) Notice: Subject to any disclaimer, the term of this patent is extended or adjusted under 35 U.S.C. 154(b) by 168 days.

(21) Appl. No.: 13/655,670

(22) Filed: Oct. 19, 2012

(65) Prior Publication Data

US 2014/0115418 A1   Apr. 24, 2014

(51) Int. Cl.  
*H03M 13/00*   (2006.01)

(52) U.S. Cl.  
USPC ............ 714/758; 714/752; 710/105; 719/326

(58) Field of Classification Search  
USPC .................... 714/752, 758; 710/105; 719/326  
See application file for complete search history.

(56) References Cited

U.S. PATENT DOCUMENTS

| 8,127,059 B1 * | 2/2012 | Carr et al. ....................... 710/74 |
| 2008/0201725 A1 * | 8/2008 | Elliott et al. .................. 719/326 |

* cited by examiner

*Primary Examiner* — Sam Rizk  
(74) *Attorney, Agent, or Firm* — Duft Bornsen & Fettig

(57) ABSTRACT

Methods and apparatus for enabling FCS and zoning operations in an enhanced SAS expander. Features and aspects hereof provide for enhanced logic within a SAS expander to detect receipt of an SAF in a zoning capable SAS expander and to modify the SAF to correct the zone group identifier and associated CRC to enable switching among a plurality of established connection (as provided by FCS enhancement) while maintaining accurate zoning information.

20 Claims, 4 Drawing Sheets

METHODS AND APPARATUS FOR ZONE GROUP IDENTIFIER REPLACEMENT IN FAST CONTEXT SWITCHING ENHANCED SERIAL ATTACHED SCSI EXPANDERS

BACKGROUND

1. Field of the Invention

The invention relates generally to SAS expanders and more specifically relates to implementation of zoning in SAS expanders enhanced for Fast Context Switching (FCS) capability.

2. Discussion of Related Art

In a SAS environment, one or more SAS initiator devices are coupled with one or more SAS target devices through zero or more intermediate SAS expanders. In general, the collection of SAS expanders (that provide switchable connections between the various initiator and target devices) is referred to as a SAS Service Delivery Subsystem (SDS).

SAS standards provide a feature known as zoning in which zone group identifiers may be associated with each physical link (PHY) of a SAS expander and a zone permissions table may be utilized within the expander to indicate whether devices associated with a first zone group identifier may access devices associated with each other zone group identifier. This zoning feature permits enhanced flexibility in providing security in large enterprise applications where, for example, various individuals or departments of an enterprise may access certain devices in the SAS domain but cannot access other devices in the same domain.

In accordance with present SAS specifications, an open connection is initially established by a SAS initiator transmitting an Open Address Frame (OAF) through the SDS and receiving an acceptance (OPEN_ACCEPT primitive) from the identified SAS target device. The open request and acceptance are routed and passed through each SAS expander between the initiator and target. Once such a connection is established, all PHYs used for the connection by SAS expanders intermediate the initiator and target devices are essentially in a "pass-through" mode until DONE primitives and CLOSE primitives are exchanged between the devices (to thereby close the established connection). Once an expander senses that a previously established connection has been closed, it may again enter its state machine logic to await receipt of a next OAF to establish another connection.

In general, when zoning features are enabled in the SAS expanders, a zone group identifier is associated with a device requesting opening of a connection. That zone group identifier is then forwarded as part of the OAF to allow each expander to determine whether access to the identified SAS target device is permitted in accordance with the zoning configuration. Zone permissions are inspected at each expander to determine whether the zone group identifier associated with the initiator device requesting the connection is permitted to access the zone group identifier associated with the destination target device.

In initially establishing such a requested connection, SAS expanders intermediate the initiator and target devices acquire various resources within the expander to identify the requested connection and identify appropriate routing through PHYs of the expanders to establish and utilize the connection. When the SAS expander detects closure of a previously established connection, resources previously acquired for that connection are released for reuse to establish other connections within the expander.

In some recent developments, one vendor has proposed enhancements or extensions to the SAS protocols to allow multiple connections between a single initiator and multiple SAS target devices to remain open or established such that switching between connections may be performed by a faster switch operation rather than "tearing down" all resources by closing an established connection and re-opening another connection. For example, LSI Corporation proposes enhancements or extensions to the SAS protocols referred to as Fast Context Switching (FCS). An FCS enhanced SAS expander that is coupled to multiple SAS target devices is enhanced to maintain multiple established, open connections and to detect receipt of a new form of SAS frame that requests a fast context switch from the currently utilized, previously established connection to a another presently open, previously established connection. Thus, multiple established connections may remain open between a single SAS initiator and multiple SAS target devices and a new SAS frame (e.g., a SWITCH Address Frame—"SAF") may be used to rapidly switch between previously established connections without incurring the overhead of "tearing down" and "setting up" each connection sequentially. In essence, the SAF is processed the same as an OAF if there is no presently established connection that may be re-used for the requested new connection. However, if another previously established connection may be re-used, the SAF processing avoids all the overhead processing of "tearing down" and "setting up" connections each time a new connection is requested.

A problem arises in such proposed FCS enhanced SAS expanders in that zoning information required to switch among previously established connections is not correctly passed through the SDS to allow proper determination of zone permissions. In particular, in normal SAS zoning processing, an initiator device transmits an OAF having a zone group identifier field set to zero. The first zoning SAS expander (i.e., first SAS expander within the Zoned Portion of a SAS Delivery Subsystem—ZPSDS) determines the appropriate, configured zone group identifier for the source PHY on which the OAF was received. This first SAS expander then modifies the received OAF to replace the zone group identifier with a predetermined, assigned zone group identifier. The modified OAF is then forwarded through the SDS to establish an appropriate route and connection through the SDS. This and subsequent expanders of the SDS may utilize the corrected zone group identifier to determine whether zone group permissions allow the requested connection. However, in accordance with SAS standards, once an open connection is established, all SAS expanders along the path between the initiator and target devices are in a bypass or pass-through mode essentially ignoring the content of information exchanged between initiator and target until the connection is closed. Thus, an SAF requesting a switch to another previously opened connection may not receive the same processing as an OAF to correct the zone group identifier. Thus, zoning and FCS enhancements have been incompatible.

Thus it is an ongoing challenge to provide mechanisms to combine FCS enhancements in combination with standard SAS zoning features.

SUMMARY

The present invention solves the above and other problems, thereby advancing the state of the useful arts, by providing methods and apparatus for enabling FCS and zoning operations within a SAS expander. Features and aspects hereof provide for enhanced logic within a SAS expander to detect receipt of an SAF in an expander and to modify the SAF to correct the zone group identifier and associated CRC to enable switching among a plurality of established connections (as provided by FCS enhancement) while maintaining accurate zoning information.

In one aspect hereof, an apparatus is provided within an FCS enhanced SAS expander of a ZPSDS. The apparatus comprising a zone information memory for storing zone group identifiers for a source PHY of each of one or more established connections. The apparatus further comprising an SAF modification circuit coupled with the zone information memory and operable to detect receipt of an SAF on the source PHY from a SAS initiator device requesting a switch to another previously established connection. The SAF modification circuit is further operable to retrieve a zone group identifier from the zone information memory. The SAF modification circuit is further operable to generate a modified SAF by replacing a zone group identifier in the received SAF with the retrieved zone group identifier and further operable to forward the modified SAF toward a SAS target device identified in the SAF.

Another aspect hereof provides circuitry within an FCS enhanced SAS expander of a ZPSDS. The circuitry comprising an SAF detection circuit adapted to detect receipt of an SAF from a source PHY of the expander and a zone replacement circuit adapted to replace a zone group identifier in a received SAF with a saved zone group identifier associated with a source PHY and associated with a SAS target device identified in the received SAF. The circuitry further comprises a CRC replacement circuit adapted to replace a CRC in a received SAF with a re-generated CRC based on the saved group identifier. The SAF detection circuit is further adapted to enable forwarding of a corrected SAF to a destination PHY of the expander wherein the corrected SAF comprises the received SAF with the saved zone group identifier and the re-generated CRC.

Still another aspect hereof provides a method operable in an FCS enhanced SAS expander of a ZPSDS. The method comprising establishing multiple connections between a SAS initiator device and multiple SAS target devices through one or more FCS enhanced expanders. The method further comprises receiving a Switch Address Frame (SAF) from the SAS initiator device and forwarding a modified SAF to a next FCS enhanced expander of the ZPSDS. The modified SAF comprises the received SAF with a saved zone group identifier and a re-generated cyclic redundancy check (CRC).

DETAILED DESCRIPTION OF THE DRAWINGS

Figure 1:
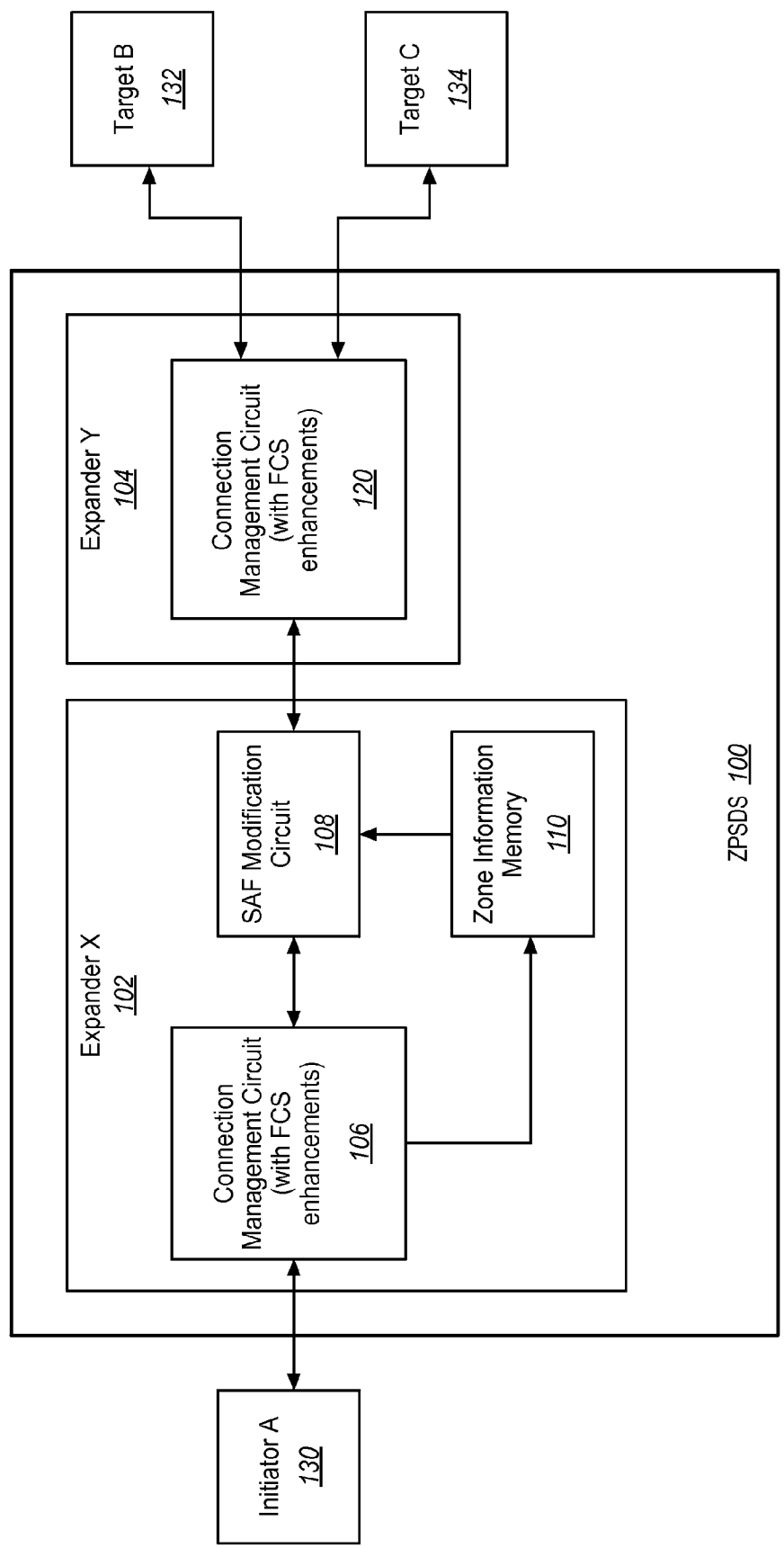
FIG. 1 is a block diagram of an exemplary system including a SAS expander enhanced in accordance with features and aspects hereof to enable FCS operations in conjunction with SAS zoning features.

FIG. 1 is a block diagram of a Zoned Portion of a SAS Delivery Subsystem (ZPSDS) 100 comprising a first SAS expander "X" 102 enhanced in accordance with features and aspects hereof to provide for SAS zoning features even in the presence of Fast Context Switching (FCS) enhancements within the ZPSDS 100.

Fast Context Switching (FCS) Background

Before discussing the present invention, a preliminary note is valuable to generally discuss the purpose, operation, and structure of FCS enhancements in a SAS domain. Using existing SAS protocol (as defined through the SAS 2 specification) the full collection of pathways (pathways through expanders) between an identified SAS initiator device and an identified SAS target device must be completely "torn down" whenever a new pathway between these devices is required. Whenever a new connection is required, each expander between the two end devices participates in establishing that requested connection. Assuming there are a number ("N") of expanders between the two end devices, if each expander takes "ConDelay" amount of time to perform the necessary "set up" and "tear down" steps in the connection, the overall connection overhead time can be roughly calculated as:

$$\text{ConnectionTime}=N*\text{ConDelay}$$

Thus, to establish 32 such connections different connections between an initiator and 32 different target devices, the total overhead time to establish connections would be:

$$\text{ConnectionTime}=32*N*\text{ConDelay}$$

FCS features provide a new method in enhancements to the SAS protocol to reuse the connection pathways in the expanders between two end devices and to perform localized connection/context switches only at the last expander in the chain of expanders coupling the initiator with the identified SAS target device (i.e., a context switch is performed with the last expander that is directly coupled with the SAS target devices). The "context" for each connection within this last expander is saved so that the set up and tear down overhead is incurred only in the last of the expanders in the chain. Using this approach, the time to perform 32 connections would be:

$$\text{ConnectionTime}=(N*\text{ConDelay})+(31*\text{ConDelay})$$

If you assume N=5 expanders, and ConDelay of 200 ns, then the difference between these is 32 us versus 7.2 us, which is significant.

In existing SAS protocols, when an end device determines that it has no more frames to transmit to the other end device, it transmits a DONE primitive. When the DONE primitives have been exchanged between each of the end devices to indicate that neither presently has data to be sent to the other, the devices are then required to exchange CLOSE primitives. This CLOSE primitive exchange is the stimulus for each expander in the pathway between the connected initiator and target to tear down its piece of the pathway, resulting in the need to re-establish every piece of the pathway again on a subsequent connection.

For example, in accordance with present SAS standard protocols, exchanges between a single initiator ("I") and three different targets ("T1", "T2", and "T3") may proceed as follows:

| From "I" to "Tx" | From "Tx" to "I" |
|---|---|
| OPEN (establish new connection to T1) (resources acquired in expanders) <frame traffic in connection with T1> | OPEN_ACCEPT <frame traffic in connection with T1> |

-continued

| From "I" to "Tx" | From "Tx" to "I" |
|---|---|
| DONE | DONE |
| CLOSE | CLOSE |
|  | (resources within expanders released) |
| OPEN (establish new connection to T2) |  |
| (resources acquired in expanders) | OPEN_ACCEPT |
| <frame traffic in connection with T2> | <frame traffic in connection with T2> |
| DONE | DONE |
| CLOSE | CLOSE |
|  | (resources within expanders released) |
| OPEN (establish new connection to T3) |  |
| (resources acquired in expanders) | OPEN_ACCEPT |
| <frame traffic in connection with T3> | <frame traffic in connection with T3> |
| DONE | DONE |
| CLOSE | CLOSE |
|  | (resources within expanders released) |
| OPEN (establish new connection to T1) |  |
| (resources acquired in expanders) | OPEN_ACCEPT |
| <frame traffic in connection with T1> | <frame traffic in connection with T1> |
| . . . | . . . |

In an FCS enhanced expander such as those from LSI Corporation, an enhanced expander to which an end device is directly coupled modifies the use of the DONE primitives by the directly coupled end device. Using a new primitive (herein named "DONE(SWITCH)" as distinct from the primitive used in a SAS standard herein named "DONE(NORMAL)"), the expander can communicate the intention that traffic for the current connection is complete, but a new SAS "switch" is permitted to re-use the resources of the established connection. Use of the DONE(SWITCH) primitive indicates that the typical CLOSE primitive exchange will not be performed. Instead, a new type of frame, herein named a Switch Address Frame (SAF), is transmitted to communicate the new connection information. In some embodiments, the Switch Address Frame (SAF) uses the same information as contained in the SAS standard Open Address Frame (OAF), with the Frame Type field modified to a value of 0x2. Processing of an SAF then follows similar processing as existing OAF processing in determining what connection gets established and what resources are needed. If the new connection can utilize resources (e.g., pathways) of an existing connection, few or no new resources need be allocated. If the SAF requested connection is a new (not yet established) connection that cannot benefit from use of other existing connections, then resources are allocated and the SAF is processed as a standard OAF within the expanders of the SDS.

For example, in accordance with FCS enhancements to the SAS standard protocols, exchanges between a single initiator ("I") and three different targets ("T1", "T2", and "T3") may proceed as follows:

| From "I" to "Tx" | From "Tx" to "I" |
|---|---|
| SWITCH(T1) |  |
| (establish or re-establish connection to T1) |  |
|  | OPEN_ACCEPT |
| <frame traffic in connection with T1> | <frame traffic in connection with T1> |
| DONE(SWITCH) | DONE(NORMAL) |
| SWITCH(T2) | (resources within expanders |
| (establish or re-establish connection to T2) | NOT released for connection with T1) |
|  | OPEN_ACCEPT |
| <frame traffic in connection with T2> | <frame traffic in connection with T2> |
| DONE(SWITCH) | DONE(NORMAL) |
| SWITCH(T3) | (resources within expanders |
| (establish or re-establish connection to T3) | NOT released for connection with T2) |
|  | OPEN_ACCEPT |
| <frame traffic in connection with T3> | <frame traffic in connection with T3> |
| DONE(SWITCH) | DONE(NORMAL) |
| SWITCH(T1) | (resources within expanders |
| (re-establish connection with T1) | NOT released for connection with T3) |
|  | OPEN_ACCEPT |
| <frame traffic in connection with T1> | <frame traffic in connection with T1> |
| DONE(NORMAL) | DONE(NORMAL) |
| (SAS standard CLOSE protocol will follow) |  |
| CLOSE | CLOSE |
| (resources within expanders released for connection with T1) | (resources within expanders released for connection with T1) |

By preventing the exchange of CLOSE primitives between the end devices, previously established connections may be re-used. Without the trigger of a CLOSE primitive exchange, the expanders are not involved in the tear down of existing pathways and thus remain in a state of an open connection in which they are generally forwarding information between their SAS PHY interfaces.

In the FCS enabled "end expander" that is coupled with each of the plurality of end devices (target devices), connections to each of the plurality of end devices (directly coupled target devices) are closed and re-opened as switch requests (SAF) are received from the initiator device. The connection pathways through all other expanders intermediate the initiator device and the end expander remain open. When a switch happens, the target end device sends a CLOSE primitive that is consumed by the FCS enabled end expander. The initiator device does not send a CLOSE primitive when it is doing an FCS switch. So connection between the initiator device and the end expander is retained (including through any intermediate expanders between the initiator device and the end expander). Only the connection between the target device that sent the CLOSE primitive and the end expander is torn down. Responsive to a next switch request (SAF from the initiator device) the end expander establishes a new connection (switch) with a next addressed device.

After the initiator has requested all desired switches (i.e., transmits a DONE(NORMAL) as opposed to a DONE (SWITCH)), the CLOSE primitive from the last addressed target/end device is not consumed by the end expander and instead is sent to the initiator device. The initiator device then responds with a CLOSE primitive (in accordance with SAS standards) to cause the final teardown of all previously established connections (between the initiator device and the end expander) thus freeing resources in all intermediate expanders to establish new connections.

The FCS features may all be implemented within enhanced expanders and initiator devices largely transparent to all end/target devices (thus obviating the need for updating all expanders and target devices of an entire enterprise). An FCS enhanced "end expander" (an expander directly coupled with one or more end devices) can monitor all of the connection requests from all of its directly coupled end devices, and determine when a Switch Address Frame (SAF) may use an already established connection.

SAS Zoning with FCS

Returning now to FIG. 1 and features and aspects hereof, as noted above, such FCS enhanced expanders present a problem where SAS zoning is to be utilized in conjunction with the FCS features. In a standard expander as well as an FCS enhanced expander (i.e., expanders not enhanced with features and aspects hereof), expanders are in a pass-through (bypass) mode while in the state of an open, established connection. Expanders in such a pass-through connection state are, in essence, only awaiting detection of an exchange of CLOSE primitives to exit the pass-through state and resume awaiting a request to establish a new connection. However, where zoning features are utilized in a SAS domain (i.e., a ZPSDS is configured in the enterprise) that is further embodying FCS enhancements, features and aspects hereof allow for the SAF to be detected and its zone group identifier to be modified as necessary to permit use of zoning features within the ZPSDS in conjunction with FCS features.

In particular, expander "X" 102 embodies features and aspects hereof and comprises connection management circuit 106 coupled with SAF modification circuit 108 and zone information memory 110. Expander 102 also comprises any number of PHYs (not shown) for coupling the enhanced expander with any number of other SAS devices including, for example, a "source" PHY (not shown) for coupling expander 102 with initiator 130 and a "destination" PHY (not shown) for coupling expander 102 with expander 104 of ZPSDS 100. Connection management circuit 106 comprises any suitable logic circuits for managing the establishment and termination of connections between PHYs of expander 102. In particular, connection management circuit 106 may include Fast Context Switching (FCS) enhancements for improving performance in switching between connections of various PHYs of expander 102. In general, connection management circuit 106 may be implemented as portions of SAS link layer logic circuits associated with each PHY of the expander or any other suitable control logic within expander 102.

SAF modification circuit 108 is coupled with connection management circuit 106 to receive transmissions from a first end device (e.g. initiator "A" 130) requesting establishment of a connection with another end device (e.g., end device "B" 132 or end device "C" 134). SAF modification circuit 108 comprises any suitable logic circuits operable to detect receipt of an SAF from an end device 130 (via connection management circuit 106) requesting establishment of a new connection (OAF) to another end device and/or requesting switching of the presently active connection to another previously established connection (SAF). Upon detecting receipt of such an SAF, SAF modification circuit 108 is further operable to replace the zone group identifier in the received SAF to generate a modified SAF. Lastly, SAF modification circuit 108 forwards the modified SAF on to any further expanders of ZPSDS 100 for eventual forwarding to the identified target end device (e.g., end device "B" 132 or end device "C" 134). SAF modification circuit 108 may be integral with link layer logic or otherwise associated with logic circuits of each of the PHYs (not shown) of the expander.

Still further, expander "X" 102 of ZPSDS 100 may comprise zone information memory 110 adapted to store zone information relating to connections presently established between PHYs of expander "X" 102. More specifically, when a requested connection is initially established, an entry may be generated by connection management circuit 106 in zone information memory 110 indicating the correct zone group identifier to be associated with the particular PHY involved in a requested connection. Just as the zone group identifier in an OAF is replaced with a corrected identifier by a standard, zoning capable SAS expander, so too SAF modification circuit 108 replaces the zone group identifier in a received SAF by accessing information stored in zone information memory 110. The SAF so modified by replacing its zone group identifier may then be forwarded through the remainder of ZPSDS 100 to allow completion of establishing the requested connection while appropriately processing and verifying required access utilizing zone permission tables in the ZPSDS. By replacing the zone group identifier within the modified SAF to be forwarded through ZPSDS 100, a subsequent expander that is directly coupled with the identified end device is able to perform appropriate zone permission verification using the zone group identifier in the received, modified SAF.

It will be readily recognized by those of ordinary skill in the art that circuitry comprising connection management circuit 106, SAF modification circuit 108, and the zone information memory 110 may be integrated within a single integrated circuit die or may be separated as any number distinct integrated circuit dies as a matter of design choice. Further, the circuits of the enhanced expander 102 may be integrated with other standard logic of the expander such as link layer SAS management circuits, etc.

Still further, those of ordinary skill in the art will readily recognize that expander "X" 102 is the first SAS expander within ZPSDS 100 to receive an OAF or SAF from an end device such as initiator "A" 130. Expander "X" 102 may therefore be directly coupled with initiator "A" 130 through an appropriate PHY (not shown) of expander "X" 102. In other embodiments, although expander "X" 102 is the first expander of ZPSDS 100, other non-zoning-capable expanders may be present intermediate expander "X" 102 and initiator "A" 130. Such other expanders are not a part of ZPSDS 100 and thus do not engage in the zone processing features of ZPSDS 100. Still further, those of ordinary skill in the art will recognize that any number of SAS expanders may be configured intermediate expander "X" 102 and expander "Y" 104 within ZPSDS 100. Or, in other exemplary embodiments, expander "X" 102 may be directly coupled with both an initiator and target of a requested connection and thus may perform both the zone group identifier replacement function of SAF modification circuit 108 and the zone permission verification function of end expander "Y" 104 directly coupled with an identified SAS target device. These and other configurations will be readily apparent to those of ordinary skill in the art as a matter of design choice.

Figure 2:
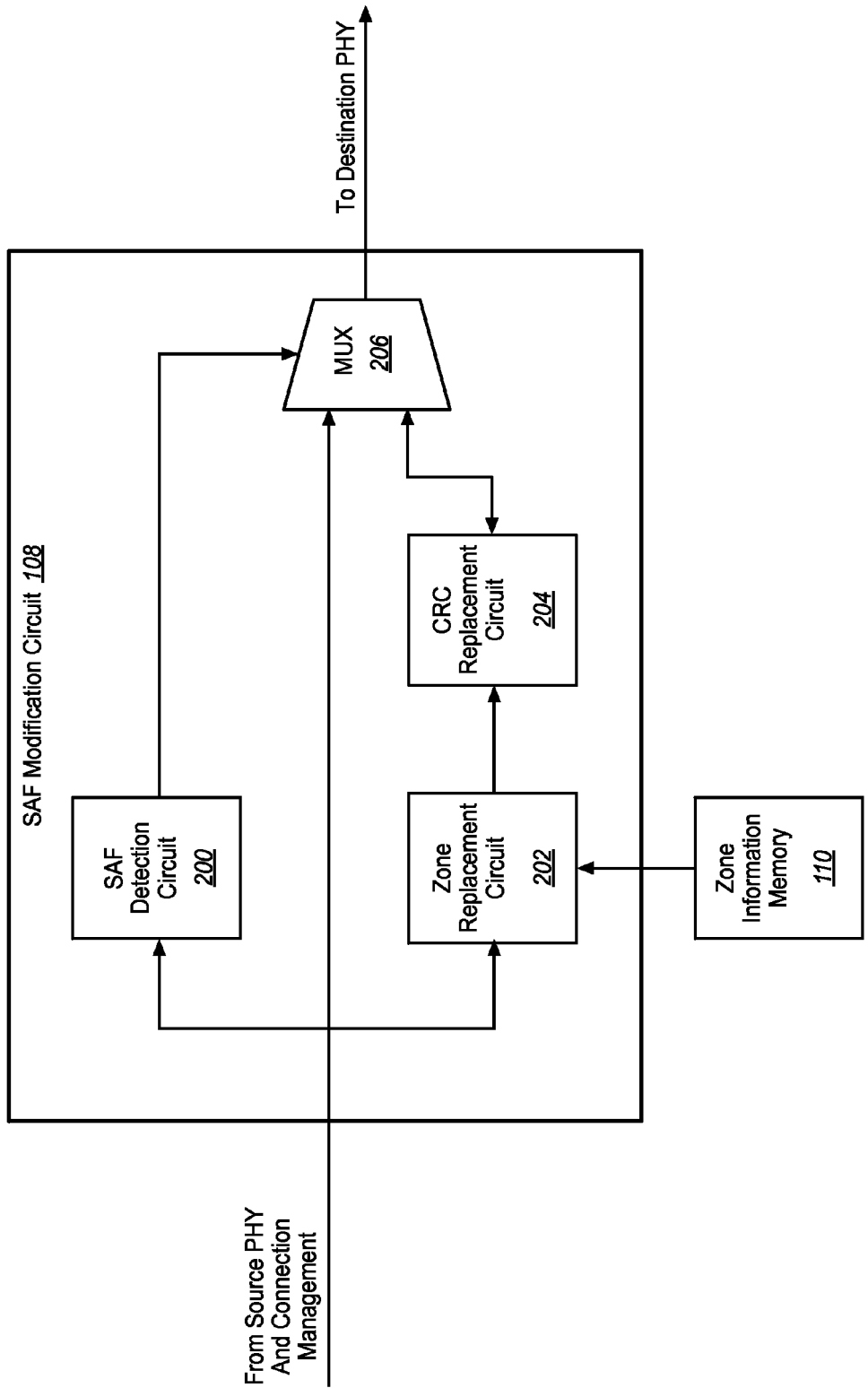
FIG. 2 is a block diagram providing exemplary additional details for a SAF modification circuit as shown in FIG. 1.

FIG. 2 is a block diagram providing exemplary additional details of an embodiment of SAF modification circuit 108. SAF detection circuit 200 of circuit 108 is coupled to receive OAF and/or SAF transmissions from a first end device through a source PHY of the expander (e.g., passed through the connection management circuit as in FIG. 1). Upon detecting receipt of such an SAF through the source PHY, SAF detection circuit 200 enables a selection input of multiplexer 206 to determine the presently selected output of multiplexer 206. Multiplexer 206 is coupled to receive as a first input the un-modified transmissions received through the source PHY (e.g., through the connection management circuit as in FIG. 1). This input may be selected to be applied as an output of multiplexer 206 to the destination PHY for eventual transmission to an identified SAS target device. Further, circuit 108 comprises zone replacement circuit 202 coupled to receive un-modified transmissions from the source PHY and to output a modified version of any such transmission that is detected as an SAF. The modified SAF transmitted from the zone replacement circuit 202 comprises a replacement zone group identifier retrieved from zone information memory 110. The SAF so modified is then applied to CRC replacement circuit 204 which re-generates a corrected, replacement CRC value for the modified SAF to be transmitted. The modified SAF with a re-generated, replacement CRC value is then applied as a second input to multiplexer 206. When SAF detection circuit 200 detects receipt of an SAF, the selection input applied to multiplexer 206 selects the output of CRC replacement circuit 204 to be applied to the destination PHY. As a matter of design choice, various delay circuits/logic may be utilized in the implementation of the circuits of FIG. 2 to adjust for latency between the detection of a received SAF by circuit 200 and the generation of the modified SAF by circuits 202 and 204 for forwarding to the SAS target through a destination PHY.

Those of ordinary skill in the art will readily recognize numerous additional and equivalent elements that may be present in a fully functional SAS expander and related circuits such as depicted in FIGS. 1 and 2. Such additional and equivalent elements are omitted herein for simplicity and brevity of this discussion.

Figure 3:
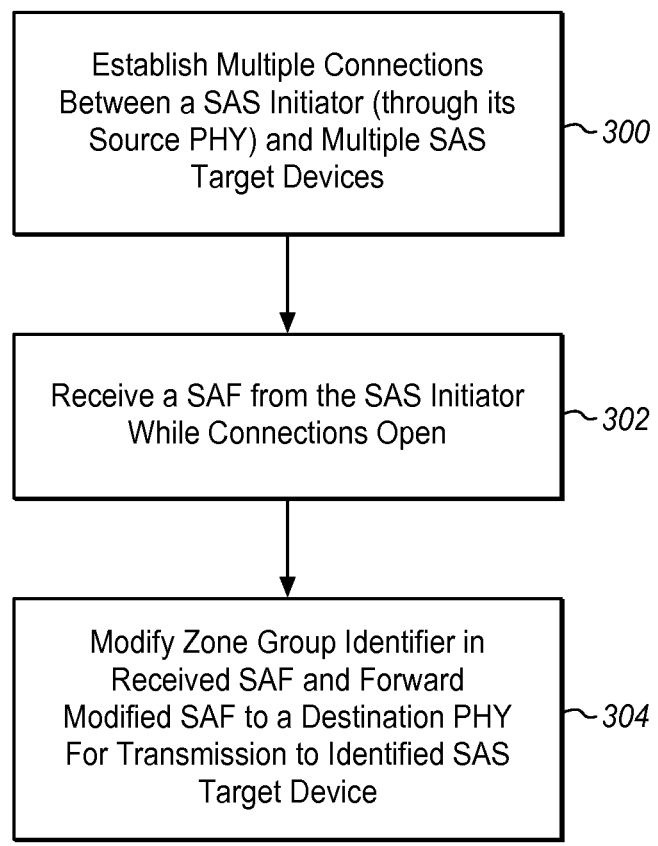
FIG. 3 is a flowchart describing an exemplary method in accordance with features and aspects hereof to enable FCS operation in a zoning capable expander.

FIG. 3 is a flowchart describing an exemplary method for enabling SAS zone permission processing in the context of an FCS enhanced SAS expander in accordance with features and aspects hereof. The method of FIG. 3 may be operable in an enhanced SAS expander such as expander 102 of FIG. 1. More specifically, the method of FIG. 3 may be operable in an SAF modification circuit 108 as shown in FIGS. 1 and 2. At step 300, the SAS expander performs standard processing to establish multiple connections between a first SAS end device and multiple other SAS end devices (e.g., between a single initiator device and multiple SAS target devices). The first end device may be coupled to the expander through a first PHY (generally referred to as the source PHY). The multiple other end devices (e.g., multiple SAS target devices) may each be accessible through a common path of the ZPSDS. The common path is accessible from the SAS expander through a single destination PHY. At step 302, a SAF detection circuit within the enhanced SAS expander detects reception of an SAF from the SAS initiator device while one or more previously established connections remain open between the SAS initiator and one or more other SAS target devices. Responsive to detection of receipt of an SAF, step 304 modifies the zone group identifier in the received SAF and forwards the modified SAF to the appropriate destination PHY for eventual transmission through the ZPSDS to the identified SAS target device.

Figure 4:
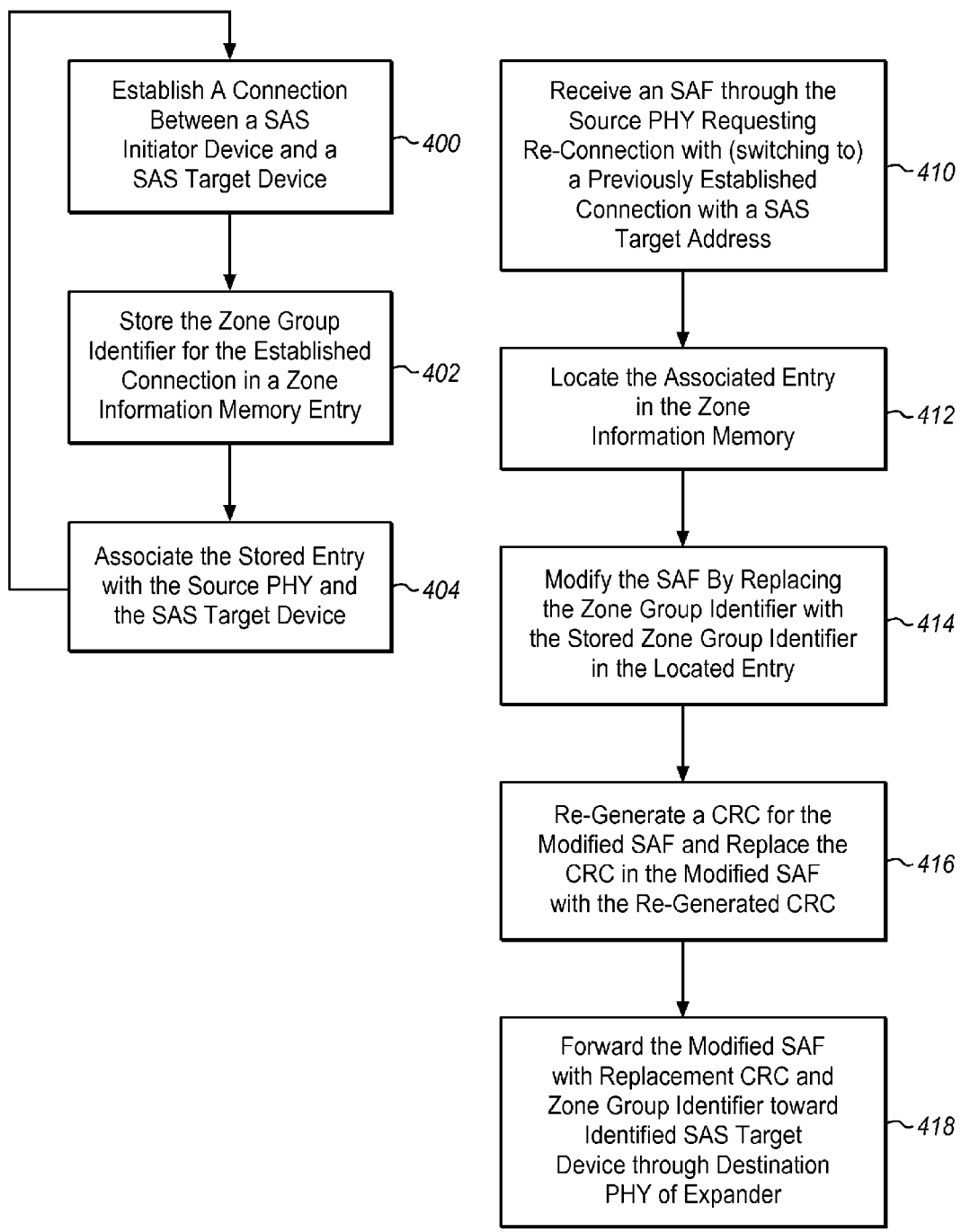
FIG. 4 is a flowchart describing another exemplary method in accordance with features and aspects hereof to enable FCS operation in a zoning capable expander.

FIG. 4 is a flowchart describing another exemplary method in accordance with features and aspects hereof to enable use of SAS zoning features in combination with FCS features of an enhanced SAS expander. The method of FIG. 4 is similarly operable within an enhanced SAS expander such as expander 102 of FIG. 1 and more specifically within the enhanced circuits 106, 108, and 110 of FIGS. 1 and 2. Steps 400 through 404 may be generally operable within connection management circuit 106 of expander 102 of FIG. 1 to establish one or more connections between a SAS initiator device coupled through a source PHY of the expander and multiple SAS target devices each accessible through a common destination PHY of the expander (and generally through a common path of the ZPSDS). At step 400 a connection is established between a SAS initiator device and an identified SAS target device. Standard OAF processing may be utilized within the SAS expander to initially establish such connections. Alternatively, an SAF in accordance with features and aspects hereof may be utilized to initially establish a connection between the identified devices. At step 402, the zone group identifier associated with the established connection is stored in a zone information memory entry. In the initial establishment of any connection, standard SAS protocols provide for determining the appropriate zone group identifier to be associated with the newly established connection. This zone group identifier is then stored in an entry of the zone information memory to be utilized in later re-connection (SAF) requests. At step 404, the stored entry is associated with the source PHY from which the connection request was received and is associated with the SAS target device (or destination PHY) of the requested connection. Steps 400 through 404 are repeated as necessary for initially opening multiple such connections.

Step 410 through 418 are performed each time an SAF is received from the SAS initiator device (e.g., through the source phi) requesting a switch between previously established SAS connections. At step 410 an SAF is received from the source PHY requesting re-connection with (i.e., switching to) a previously established connection to a SAS target. As noted above, in a non-enhanced SAS expander, once a connection is initially established with a source PHY, all other information is simply passed through until the connection is closed, however, in accordance with features and aspects hereof, step 410 remains active attempting to detect receipt of an SAF through the source PHY requesting a switch to another previously established connection. At step 412, an entry is located in the zone information memory. The entry located is that which is associated with the source PHY from which the SAF was received (and associated with the identified SAS target device to be re-connected). Having located such an entry, step 414 next generates a modified SAF by replacing the zone group identifier (typically zero) in the received SAF with the stored zone group identifier from the located entry in the zone information memory. Thus, the SAF is modified to utilize the zone group identifier in the previously established connection to which the SAF is now requesting a switch. Step 416 next re-generates a CRC value for the modified SAF and replaces the CRC in the modified SAF with the re-generated CRC value. The re-generated CRC is computed based on the modification to the SAF that replaced the zone group identifier. At step 418, the modified SAF with a replacement CRC and a replacement zone group identifier is forwarded toward the identified SAS target device through the destination PHY of the expander. As noted, steps 410 through 418 are then repeated for each received SAF requesting a switch to a previously established connection.

Those of ordinary skill in the art will readily recognize numerous additional an equivalent steps in fully functional methods such as the method of FIG. 3 and four. Such additional an equivalent steps are omitted. Herein for simplicity and brevity of this discussion.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. Apparatus within a Fast Context Switch (FCS) enhanced Serial Attached SCSI (SAS) expander of a Zoned Portion of a Service Delivery Subsystem (ZPSDS), the apparatus comprising:
a zone information memory for storing zone group identifiers for source physical links (PHY) of each of one or more established connections; and
a Switch Address Frame (SAF) modification circuit coupled with the zone information memory and operable to detect receipt of an SAF on a source PHY from a SAS initiator device requesting a switch to another previously established connection, the SAF modification circuit further operable to retrieve a zone group identifier from the zone information memory and further operable to generate a modified SAF by replacing a zone group identifier in the received SAF with the retrieved zone group identifier and further operable to forward the modified SAF toward a SAS target device identified in the SAF.

2. The apparatus of claim 1
wherein the SAF modification circuit is further operable to replace the zone group identifier in the received SAF to generate the modified SAF and is further operable to replace the cyclic redundancy check value in the modified SAF with a recalculated cyclic redundancy check.

3. The apparatus of claim 2, wherein:
the recalculated cyclic redundancy check is determined based on the retrieved zone group identifier.

4. The apparatus of claim 1 further comprising:
a connection management circuit coupled with the zone information memory and communicatively coupled with the SAF modification circuit, the connection management circuit operable to establish one or more connections between PHYs of the expander, each connection established between a source PHY and a destination PHY of the expander through which an identified SAS target device may be accessed, wherein the connection management circuit is further operable to establish the connection in response to receipt of an Open Address Frame (OAF) from the SAS initiator device, the OAF identifying the SAS target device of the connection, wherein the connection management circuit is further operable to store in the zone information memory a zone group identifier associated with the source PHY of each established connection.

5. The apparatus of claim 4
wherein the SAF modification circuit is further operable to generate modified SAFs received on any of one or more established connections.

6. The apparatus of claim 4
wherein the connection management circuit is further operable to establish multiple connections between multiple SAS initiator devices and multiple SAS target devices,
wherein the connection management circuit is further operable to store multiple zone group identifiers in the zone information memory, each zone group identifier associated with a corresponding source PHY coupled with an associated SAS initiator device of an established connection and associated with the identified SAS target of the established connection.

7. Circuitry within a Fast Context Switch (FCS) enhanced Serial Attached SCSI (SAS) expander of a Zoned Portion of a Service Delivery Subsystem (ZPSDS), the circuitry comprising:
a Switch Address Frame (SAF) detection circuit adapted to detect receipt of an SAF from a source physical link (PHY) of the expander;
a zone replacement circuit adapted to replace a zone group identifier in a received SAF with a saved zone group identifier associated with s source PHY and associated with a SAS target device identified in the received SAF; and
a cyclic redundancy check (CRC) replacement circuit adapted to replace a CRC in a received SAF with a re-generated CRC based on the saved group identifier,
wherein the SAF detection circuit is further adapted to enable forwarding of a corrected SAF to a destination PHY of the expander wherein the corrected SAF comprises the received SAF with the saved zone group identifier and the re-generated CRC.

8. The apparatus of claim 1, wherein:
the SAS modification circuit is further operable to retrieve the zone group identifier from the zone information memory based on an entry in the zone information memory for the source PHY on which the SAF was received.

9. The apparatus of claim 1, further comprising:
a delay circuit operable to adjust for latency between detection of a received SAF and generation of a modified SAF.

10. Circuitry within a Fast Context Switch (FCS) enhanced Serial Attached SCSI (SAS) expander of a Zoned Portion of a Service Delivery Subsystem (ZPSDS), the circuitry comprising:
a Switch Address Frame (SAF) detection circuit adapted to detect receipt of an SAF from a source physical link (PHY) of the expander;
a zone replacement circuit adapted to replace a zone group identifier in the received SAF with a saved zone group identifier associated with the source PHY and associated with a SAS target device identified in the received SAF; and
a cyclic redundancy check (CRC) replacement circuit adapted to replace a CRC in the received SAF with a re-generated CRC based on the saved group identifier,
wherein the SAF detection circuit is further adapted to enable forwarding of a corrected SAF to a destination PHY of the expander wherein the corrected SAF comprises the received SAF with the saved zone group identifier and the re-generated CRC.

11. The method of claim 9 further comprising:
replacing a CRC in the received SAF with the re-generated CRC to generate the modified SAF.

12. The circuitry of claim 10, further comprising:
a delay circuit operable to adjust for latency between detection of the received SAF and generation of the corrected SAF.

13. A method operable in a Fast Context Switch (FCS) enhanced Serial Attached SCSI (SAS) expander of a Zoned Portion of a Service Delivery Subsystem (ZPSDS), the method comprising:
establishing multiple connections between a SAS initiator device and multiple SAS target devices through one or more FCS enhanced expanders;
receiving a Switch Address Frame (SAF) from the SAS initiator device; and forwarding a modified SAF to a next FCS enhanced expander of the ZPSDS wherein the modified SAF comprises the received SAF with a saved zone group identifier and a re-generated cyclic redundancy check (CRC).

14. The method of claim 13 further comprising:
replacing a zone group identifier in the received SAF with the saved zone group identifier to generate the modified SAF.

15. The method of claim 13 further comprising:
replacing a CRC in the received SAF with the re-generated CRC to generate the modified SAF.

16. The method of claim 13
wherein the step of establishing multiple connections further comprises storing, for each established connection, a zone group identifier in a memory as a saved zone group identifier associated with that connection.

17. The method of claim 16
wherein the step of storing further comprises associating each saved zone group identifier with a source PHY and with an identified SAS target device.

18. The method of claim 13, further comprising:
selecting the saved zone group identifier based on an entry in a zone information memory for a source PHY from which the SAF was received.

19. The method of claim 13, further comprising:
adjusting for latency between detection of the received SAF and generation of the modified SAF.

20. The method of claim 13, further comprising:
re-generating the CRC based on the saved zone group identifier of the modified SAF.

* * * * *